US012596304B2

(12) United States Patent
Gädda et al.

(10) Patent No.: US 12,596,304 B2
(45) Date of Patent: Apr. 7, 2026

(54) SILANOL-CONTAINING ORGANIC-INORGANIC HYBRID COATINGS FOR HIGH RESOLUTION PATTERNING

(71) Applicant: Pibond Oy, Espoo (FI)

(72) Inventors: Thomas Gädda, Espoo (FI); Luong Dang Nguyen, Espoo (FI); Markus Laukkanen, Espoo (FI); Kimmo Karaste, Espoo (FI); Juha Rantala, Espoo (FI); Jonathan Glen, Espoo (FI)

(73) Assignee: Pibond Oy, Espoo (FI)

( * ) Notice: Subject to any disclaimer, the term of this patent is extended or adjusted under 35 U.S.C. 154(b) by 673 days.

(21) Appl. No.: 17/267,521

(22) PCT Filed: Aug. 12, 2019

(86) PCT No.: PCT/FI2019/050584

§ 371 (c)(1),
(2) Date: Feb. 10, 2021

(87) PCT Pub. No.: WO2020/030855

PCT Pub. Date: Feb. 13, 2020

(65) Prior Publication Data

US 2021/0311394 A1 Oct. 7, 2021

(30) Foreign Application Priority Data

Aug. 10, 2018 (FI) ...................................... 20185677

(51) Int. Cl.
*G03F 7/075* (2006.01)
*C08G 77/12* (2006.01)
(Continued)

(52) U.S. Cl.
CPC ........... *G03F 7/0757* (2013.01); *C08G 77/12* (2013.01); *C08G 77/16* (2013.01); *G03F 7/0045* (2013.01);
(Continued)

(58) Field of Classification Search
CPC ........ G03F 7/0757; C08G 77/12; C08G 77/16
See application file for complete search history.

(56) References Cited

U.S. PATENT DOCUMENTS 4,310,678 A 1/1982 Blizzard et al.
4,753,855 A * 6/1988 Haluska ................ H01L 23/291 427/249.15
(Continued)

FOREIGN PATENT DOCUMENTS

CN 1832982 A 9/2006
CN 102245674 A 11/2011
(Continued)

OTHER PUBLICATIONS https://www.ferroglobe.com/solutions/silicon-metal (Year: 2025).*
(Continued)

*Primary Examiner* — Jonathan Johnson
*Assistant Examiner* — Alexander N. Lee
(74) *Attorney, Agent, or Firm* — Laine IP Oy

(57) ABSTRACT

Silanol-containing organic-inorganic hybrid coatings on semiconductor substrates for forming patterns thereon. The present coatings can be produced by coating of semiconductor substrates with metal and silanol containing polyhydridosilsesquioxane resin solutions. Provided herein is also a method for patterning a metal and silanol containing polyhydridosilsesquioxane coated substrate with radiation of light at a specific wavelength, the method comprising the steps of irradiating a coated substrate along a selected pattern to form an irradiated structure with a region of irradiated coating and a region with un-irradiated coating and selectively developing the irradiated structure to remove a substantial portion of the un-irradiated coating to form a patterned substrate. The invention allows for obtaining a preselected silanol content polyhydridosilsesquioxane resin,
(Continued)

and adjustment of the silanol content will make it possible to obtain a highly sensitive coating for application in EUV.

2 Claims, 5 Drawing Sheets

(51) Int. Cl.

| | |
|---|---|
| ***C08G 77/16*** | (2006.01) |
| ***G03F 7/004*** | (2006.01) |
| ***G03F 7/039*** | (2006.01) |
| ***G03F 7/20*** | (2006.01) |
| ***G03F 7/38*** | (2006.01) |
| ***G03F 7/40*** | (2006.01) |

(52) U.S. Cl.

CPC .......... *G03F 7/0392* (2013.01); *G03F 7/2004* (2013.01); *G03F 7/38* (2013.01); *G03F 7/40* (2013.01)

(56) References Cited

U.S. PATENT DOCUMENTS

| | | | | |
|---|---|---|---|---|
| 4,999,397 | A | 3/1991 | Weiss et al. | |
| 5,010,159 | A | 4/1991 | Bank et al. | |
| 5,085,893 | A | 2/1992 | Weiss et al. | |
| 5,238,787 | A * | 8/1993 | Haluska | G03F 7/0757 430/311 |
| 5,707,681 | A | 1/1998 | Bremmer et al. | |
| 5,776,235 | A | 7/1998 | Camilletti et al. | |
| 5,789,460 | A | 8/1998 | Harkness et al. | |
| 5,891,529 | A | 4/1999 | Harkness et al. | |
| 6,004,730 | A | 12/1999 | Mikoshiba et al. | |
| 2004/0058090 | A1 | 3/2004 | Waldfried et al. | |
| 2004/0099181 | A1* | 5/2004 | Tateishi | D06P 5/30 106/31.77 |
| 2007/0134916 | A1* | 6/2007 | Iwabuchi | G03F 7/091 438/669 |
| 2007/0264587 | A1* | 11/2007 | Hu | G03F 7/0757 106/610 |
| 2009/0136869 | A1* | 5/2009 | Ogihara | G03F 7/11 430/316 |
| 2010/0019399 | A1* | 1/2010 | Kimura | C08L 51/085 430/326 |
| 2010/0089451 | A1 | 4/2010 | Harimoto et al. | |
| 2011/0042790 | A1* | 2/2011 | Lin | H01L 21/31144 438/761 |
| 2012/0118856 | A1* | 5/2012 | Fu | H01L 21/3122 264/225 |
| 2014/0120730 | A1* | 5/2014 | Nakajima | G03F 7/0752 524/588 |
| 2014/0234785 | A1 | 8/2014 | Hatakeyama et al. | |
| 2014/0268082 | A1* | 9/2014 | Michaelson | G03F 7/167 118/725 |
| 2014/0322519 | A1* | 10/2014 | Ahn | C08L 83/04 95/52 |
| 2015/0072275 | A1* | 3/2015 | Liu | G03F 7/0757 430/326 |
| 2016/0358777 | A1* | 12/2016 | Hatakeyama | C08K 5/1545 |
| 2024/0280905 | A1* | 8/2024 | Li | C09D 183/06 |
| 2025/0044692 | A1* | 2/2025 | Shibayama | C08G 77/14 |

FOREIGN PATENT DOCUMENTS

| | | | |
|---|---|---|---|
| CN | 103718111 | A | 4/2014 |
| EP | 0410564 | A2 | 1/1991 |
| EP | 0510872 | A1 | 10/1992 |
| EP | 0857705 | A1 | 8/1998 |
| JP | S63152131 | A | 6/1988 |
| JP | H10183063 | A | 7/1998 |
| WO | WO2013012068 | A1 | 1/2013 |
| WO | WO2017218286 | A1 | 12/2017 |

OTHER PUBLICATIONS https://www.shinetsu.co.jp/en/products/electronics-materials/silicon-wafers/ (Year: 2025).*

De Simone et al: Photoresists in extreme ultraviolet lithography (EUVL). Adv. Opt. Technol., 2017, vol. 6, pp. 163-172.

Gangnaik et al: New Generation Electron Beam Resists: A Review. Chem. Mater, 2017, vol. 29, pp. 1898-1917.

Grigorescu et al: Resists for sub-20-nm electron beam lithography with a focus on HSQ: State of the art. Nanotechnology, 2009, vol. 20, 292001.

Harrison: Silicate cages: precursors to new materials. Journal of Organometallic Chemistry, 1997-09-20, vol. 542, No. 2, pp. 141-183.

Higgins et al: Resolution, line-edge roughness, sensitivity tradeoff, and quantum yield of high photo acid generator resists for extreme ultraviolet lithography. Jpn. J. Appl. Phys., 2011, vol. 50, pp. 1-8.

Liu et al: Nanoporous Silica Films derived from Structural Controllable Poly(silsesquioxane) Oligomers by Templating. Materials Research Society Symposium Proceedings, Jan. 1, 2003, vol. 766, pp. 309-314.

Okoroanyanwu: Molecular theory of lithography, U. Molecular Theory of Lithography. SPIE Press, 2015.

Simone et al: Progresses and Challenges of EUV Lithography Materials. J. Photopolym. Sci. Technol., 2014, vol. 27, pp. 601-610.

Watanabe: Current status and prospect for EUV lithography. 2017 7th Int. Conf. Integr. Circuit, 2017, Des. Verif, pp. 3-8.

Yang et al: Understanding of hydrogen silsesquioxane electron resist for sub-5-nm-half-pitch lithography. J. Vac. Sci. Technol. B Microelectron. Nanom. Struct., 2009, vol. 27, 2622.

* cited by examiner

SILANOL-CONTAINING ORGANIC-INORGANIC HYBRID COATINGS FOR HIGH RESOLUTION PATTERNING

FIELD OF THE INVENTION

The invention relates to radiation-based methods to perform a patterning step on a substrate using polyhydridosilsesquioxane resin coating compositions.

The invention further relates to hydrolyzed precursor solutions that can be deposited to polyhydridosilsesquioxane resin coatings that can be patterned with very high resolution by applying a masked radiation and to coated substrates and coatings formed with the precursor solutions before and after patterning.

BACKGROUND

Miniaturization of complex circuitry in microelectronic devices has traditionally been achieved through advances in the lithographic process wherein the limits of definable features has been limited by the wavelength of light used in the photolithographic process.

The industry has transitioned through general exposure tools to defined wavelengths from 436 nm (g-line), 405 nm (h-line), 365 nm (i-line), 248 nm (KrF excimer) and finally 193 nm (ArF excimer) (Okoroanyanwu 2015, Gangnaik et al. 2017, De Simone et al. 2014).

The resist material used at 248 nm and 193 nm wavelengths are chemically amplified resists (CAR), whose composition and microstructure has evolved following needs in printing ever finer features on substrates. As a continuation of this trend, extreme ultraviolet (EUV) wavelength of $\lambda$=13.5 nm (92 eV) is the major candidate for the next-generation lithography (De Simone et al. 2017).

In the last decade, significant investment has been made in the development of EUV lithography (EUVL) for mass production of integrated circuits. There are various nano-lithography techniques including electron beam lithography (EBL), soft lithography, nanoimprint lithography (NIL), photon beam lithography (PBL), or scanning probe lithography proposed to extend the scaling down of the features that can be printed on a two-dimensional surface.

Success of EUVL requires new photoresist materials which all encounter certain benefits and drawbacks. Functional photoresists should provide the RLS characteristics, that is, resolution (R), line-edge roughness (LER), and sensitivity (S) as described by Higgins et al. 2011.

There are a myriad of different material approaches that have been developed to form patterns using EUVL. On a general level these can be classified in three different categories: organic, silicon based and metal containing resists.

Organic resists, often referred as non-CAR resists, can demonstrate sufficient LER but are in great disadvantage due to the need of high doses resulting from poor EUV absorption characteristics. To increase the sensitivity of the resists, CAR materials have been employed. CAR materials on the other hand suffer from poor LER resulting mainly from statistical effects of photon shot noise and photo-acid generator distribution in the CAR.

To address the challenges of both organic type resists, formulations have been prepared with radiation sensitive components included in the resist material. Elements which have high molar absorptivity of 13.5 nm EUV photons are metals. Thus, there has been an increasing interest in metal containing resists where the metal is added to other resist materials to improve sensitivity, or the metals have been employed as molecular resists, metal oxide nanoparticle, organometallic precursors or as metal-organic frameworks.

Such resists have shown high sensitivity, resolution and thus are being considered as key candidates for future EUVL resists. However, their main disadvantage is that metals are strongly disfavored in fabrication of integrated circuits as they can disrupt the function of transistors, and that LER characteristics require improvement. Furthermore, De Simone et al. and Watanabe note that in EUV scanner, the metal species in metal-containing resists interact with atomic H or radical H* form metallic hydrides (MxHy) that is a serious risk to optics lifetime. In addition, high LER is a problem in both metal-based and chemically amplified resists (De Simone et al. 2017).

Another disadvantage of CAR is low etch resistance and instability of the pattern (Grigorescu and Hagen 2009). Thus, a CAR requires both a silicon rich middle layer and a carbon rich underlayer for pattern transfer to substrate. Inorganic resins based on metal and silicon have the benefit that the lithographic stack is simplified as the inorganic middle layer is directly patterned by EUVL.

Hydrogen silsesquioxane (HSQ) is a widely utilized negative-type electron-beam and EUVL resist material. Due to its potential for high density patterns, namely, less than 10 nm pitch structures, intensive investigations have been carried out to find an optimum process. However, it suffers from very low sensitivity, requires concentrated developers and is known to be relatively unstable during processing rendering its industrial adoption limited as described by (Yang et al. 2009).

There are several factors which can facilitate to develop a process suitable for EUVL such as developer temperature, developer concentration and developer composition. Despite the advances in prior art, functional photoresists that provide the RLS characteristics without excessive metal contamination is still being looked for.

SUMMARY OF THE INVENTION

It is an object of the present invention to provide novel hydrogen silsesquioxane resin coating compositions.

It is another object of the present invention to provide methods of producing novel hydrogen silsesquioxane resins.

It is a third object of the present invention to provide methods for patterning of a polyhydridosilsesquioxane coated substrates with radiation of light.

It is a further object of the present invention to provide coated substrates comprising radiation sensitive coatings suitable for patterning by radiation of light.

Conventional HSQ resins are free from silanol functionality. In the present invention it was surprisingly found that the presence of silanol moieties in an HSQ resin greatly enhances the pattern forming ability of the coatings compared to HSQ resins. As a result, a silanol-containing polyhydridosilsesquioxane of the present kind demonstrates higher sensitivity in EUV lithography compared to those described in literature to date.

It would appear that silanol groups of the resin, present in the film, react with intermediate reactive silicon species generated by EUV from SiH, but this is merely one possible explanation.

Further, it has been found that the addition of functionalized groups further enhanced the sensitivity of the polyhydrogensilsesquioxane resin. Addition of silicon containing precursors containing functional groups enhances solubility in aqueous developers also improves the sensitivity of the resin.

A still further finding is that in some embodiments the use of metal oxide compounds either as part of the hydrolysis mixture or added separate as additives or as nanoparticles improves the sensitivity of the resin.

Thus, the present invention provides a solution of a hydrogen silsesquioxane resin, comprising an organic liquid and from about 0.001M to about 1M silanol compared to Si—H or Si—R in silicon-oxygen network, or silicon-oxygen-metal with silicon-carbon bonds and silicon-hydrogen.

Metal and silanol containing polyhydridosilsesquioxane resin solutions of the present kind can be produced by subjecting trifunctional silanes to hydrolysis/condensation reactions with other silicon or metal containing precursors to obtain metal and silanol containing polyhydridosilsesquioxane.

These solutions can be used for producing cast silanol-containing organic-inorganic hybrid coatings on semiconductor substrates for forming patterns thereon.

The invention also provides a coated substrate comprising a radiation sensitive coating, comprising a silicon-oxygen, or silicon-oxygen-metal network with silicon-carbon bonds and silicon-hydrogen and/or with silanol bonds.

The invention further provides a method for patterning a metal and silanol containing polyhydridosilsesquioxane coated substrate with radiation of light at a specific wavelength, the method comprising the steps of irradiating a coated substrate along a selected pattern to form an irradiated structure with a region of irradiated coating and a region with un-irradiated coating and selectively developing the irradiated structure to remove a substantial portion of the un-irradiated coating to form a patterned substrate.

Further, the invention provides a method for patterning a metal and silanol containing polyhydridosilsesquioxane coated substrate with radiation of light at a specific wavelength, wherein the wavelength is 13.5 nm or less.

Still further, the invention provides a patterned substrate comprising a substrate with a surface and a first coating at selected regions along the surface and absent at other regions along the surface. Generally, the first coating comprises a silicon-oxygen, or silicon-oxygen-metal network with silicon-carbon bonds and silicon-hydrogen and/or with silanol bonds. Alternatively, the first coating is soluble in at least some organic liquids, or the first coating is soluble in aqueous bases.

More specifically, the present invention is characterized by what is stated in the characterizing part of the independent claims.

Considerable advantages are obtained by the present invention.

Thus, the present solutions can be used to cast coatings on semiconductor substrates to form patterns through subsequent bake, irradiation and development steps. In particular, the invention allows for the controlling of the microstructure of the resin in such way it is industrially feasible and solves the drawbacks of prior art. For instance, the silanol content in the metal and silanol containing polyhydridosilsesquioxane resin can be adjusted, which is highly desirable to obtained highly sensitive coating for application in EUVL.

Further, the solubility of the coating comprising silicon-oxygen, or silicon-oxygen-metal network with silicon-carbon bonds and silicon-hydrogen and/or with silanol bonds can be modified by copolymerization of precursors either restricting or facilitating the solubility of the coating to a developer.

The invention described herein addresses key RLS challenges, and in addition offers high oxygen plasma etch resistance making the simplification of the lithographic stack possible.

Additionally, the use of coatings comprising a silicon-oxygen, or silicon-oxygen-metal network with silicon-carbon bonds and silicon-hydrogen and/or with silanol bonds permits the use of industry standard 2.38 wt-% TMAH solutions to develop the patterns with means to engineer the solubility characteristics of the irradiated coating to the developer.

In an important aspect, the present invention provides siloxanes that can be patterned by irradiation.

Further features and advantages of the present technology will appear from the following detailed discussion of embodiments.

EMBODIMENTS

Figure 1:
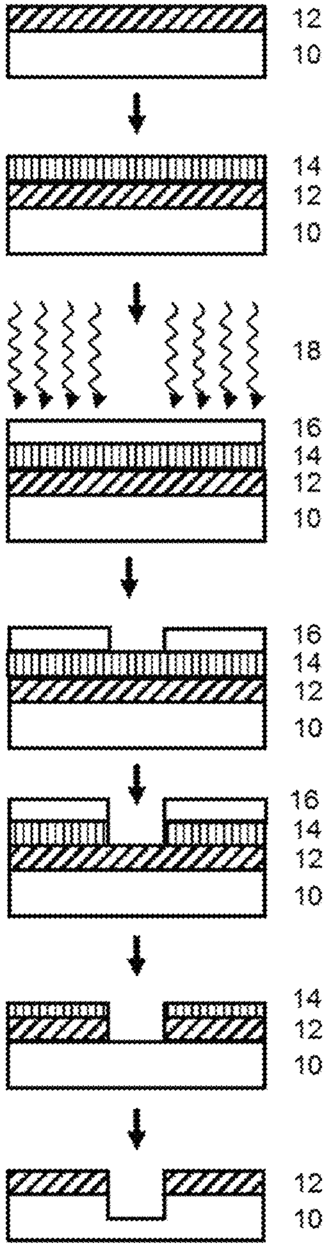
FIG. 1 shows in a schematic fashion, in side-view, the assembly of a trilayer lithography stack.

Embodiments of the present invention relate to methods of manufacturing metal and silanol containing polyhydridosilsesquioxane resin solutions wherein trifunctional silanes are subjected to hydrolysis/condensation reactions with suitable other silicon or metal containing precursors to obtain metal and silanol containing polyhydridosilsesquioxane.

The present materials can be characterized as "silanol-containing organic-inorganic hybrid materials". Such materials contain residues derived from organic compounds as well as from inorganic compounds, as will be explained below. Further, the present materials contain silanol groups, i.e. groups exhibiting the connectivity Si—O—H, typically along its main chain, in particular along its main siloxane chain.

The silicon content of the resins or the coatings is typically at least 30%, in particular 35% by weight or more. Typically, the maximum of the silicon and is about 52.9% by weight.

Generally, there is about 1 silanol group per repeating unit of the polyhydrido-silsesquioxane resin main chain. In one embodiment, there is, on an average, about 0.8 to 1.2 silanol groups for each unit of the polyhydridosilsesquioxane resin main chain.

Thus, in one embodiment there is provided a hydrogen silsesquioxane resin coating composition which comprises in liquid phase a resin exhibiting silanol (Si—OH) and silicon-hydrogen (Si—H) and optionally silicon-carbon bonds in a silicon-oxygen network, or silicon-hydrogen (Si—H) and optionally silicon-carbon bonds in a silicon-oxygen-metal network, the peak height ratio of Si—H to Si—OH being about 2:1 to 100:1.

In one embodiment, a hydrogen silsesquioxane resin coating composition is provided which comprises is in a liquid phase, from about 0.001M to about 1M silanol compared to Si—H or Si—R in a silicon-oxygen network, or silicon-oxygen-metal with silicon-carbon bonds and silicon-hydrogen.

The term "latent" when use in connection to components optionally present in the present compositions refer to a property of being activated during processing of the compositions or of the resin, for example by light. Thus, "latent" catalysts are substances which are in particular activated by light, for example when the resin or composition is exposed to light. Similarly, latent acids and bases in the compositions can be activated when being exposed to light.

According to an embodiment, the present technology relates to a composition suitable for formation of an irradiation curable siloxane layer on a substrate, said composition comprising a siloxane polymer containing SiO moieties, a plurality of reactive sites distributed along the polymer, and a first SiH portion, a second SiOH portion, and an intermediate aromatic and non-aromatic portion, a fourth portion containing metal-oxygen bonds, wherein the polymer has a molecular weight of from 500 to 50000 g/mol, and the composition preferably further comprising an acid and/or base catalyst and a solvent.

According to a preferred embodiment, the present technology relates to a composition suitable for the production of a coating formulation that can be cast on substrates, and wherein the coating on the substrate can be patterned by irradiation a patternable and in which the coating is represented by a general formula (I)

(I)

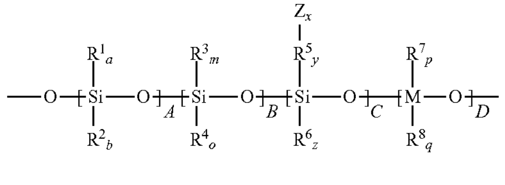

In Formula 1, the symbols A, B, C, and D each representing an integer independently selected from 1 to 1000, Z stands for functional group and M stands for a metal atom, and $R^1$ to $R^8$ stand for hydrocarbyl radicals and a, b, m, o, y, z, p, q and x each independently stand for an integer of 0 to 3.

The above composition is obtained by hydrolyzing a first monomeric hydrogen containing silicon compound having at least two or three hydrolysable groups attached to the silicon ("Precursor A") with

- optionally a second monomeric silicon compound having at least zero, one, two or three hydrocarbyl radicals, and at least one hydrolyzable group attached to the silicon atom of the compound (i.e. "Precursor B"),
- optionally a third monomeric silicon compound having at least one functional group and at least one hydrolyzable group attached to the silicon atom of the compound to form a siloxane material, wherein the functional group enhances dissolution to a developer(i.e. "Precursor C"), and
- optionally a fourth precursor based on one or more hydrolysable metal oxide precursors formulating the siloxane material into a stable composition in a suitable solvent system (i.e. "Precursor D").

In one embodiment, a Precursor B is used with optionally one or more of Precurors A, C and D.

The ratio of the precursors used in the present invention can vary. Precursor A can be used in 0-100 mol-%, Precursor B can be used in 0-50 mol-%, Precursor C can be used in 0-20 mol-%, and Precursor D can be used in 0-50 mol-%. Precursors 1 and 2 together make up at least 50 mol-%, in particular at least 60 mol-%, for example at least 70 mol-% of the composition.

The siloxane composition can be obtained by carrying out the hydrolysis and condensation in the same reaction vessel or separately in specified portions or each precursor independently.

By selecting the relative amounts of precursors, the silanol content in the polyhydridosilsesquioxane resin can be adjusted The present invention is particularly well suited for the production of compositions comprises a poly(organosiloxane) obtained by hydrolyzing a first silicon compound having the general formula II $$R^1_a—Si—R^2_b \quad (II)$$

wherein

- a is an integer of 1 or 2,
- b is an integer of 2 or 3,
- $R^1$ denotes a hydrogen atom and
- $R^2$ denotes a hydrolysable group which can independently be selected from hydroxyl, alkoxy, acyloxy and halogen.

In the meaning of "halogen", each of the hydrolysable groups preferably and independently stands for chlorine or bromine.

In the meaning of "alkoxy", each of the hydrolysable groups preferably and independently stands for an alkoxy group having 1 to 6, in particular 1 to 4 carbon atoms, such as methoxy, ethoxy, n-propoxy, i-propoxy, butoxy, sec-butoxy, or tert-butoxy. In the meaning of "acyloxy", the acyl group has 1 to 4 carbon atoms. Thus, as a hydrolysable group, each acyloxy preferably and independently stands for acetoxy, acryloxy, or methacryloxy.

Specific examples of such precursors are triethoxysilane (HTEOS), trimethoxysilane (HTMOS), diethoxysilane and trichlorosilane.

The present invention also relates to the compositions comprising a copoly(organosiloxane) obtained by hydrolyzing a first silicon compound having the general formula II, with a precursor having the general formula III $$R^3_m—SiR^2_n—R^4_o \quad (III)$$

wherein $R^3$ and $R^4$ can be independently selected from an alkyl group, an aryl group, an aralkyl group, a halogenated alkyl group, a halogenated aryl group, a halogenated aralkyl group, an organic group having an epoxy group, a mercapto group, an alkoxyaryl group, an acyloxyaryl group, an isocyanurate group, a hydroxy group, a cyclic amino group, or a cyano group, or a combination of them, $R^2$ and $R^3$ may also be an alkoxy group, an acyloxy group, or a halogen group, m is an integer of 0 to 1, n is an integer of 2 to 4, and o is an integer of 0 to 1, wherein the total value of m+n+o may not exceed 4.

The present invention further relates to the compositions comprising a copoly(organosiloxane) obtained by hydrolyzing a first silicon compound having the general formula II, with a precursor having the general formula IV $$Z_x—R^5_y—SiR^2_n—R^6_z \quad (IV)$$

wherein

Z is a group such as hydroxy, carboxylic acid, mercapto, amine or its salt, or quaternary ammonium salt facilitating solubility in aqueous developers and $R^5$ is a spacer group covalently bound to both Z and Si and can be independently selected from a bivalent group derived from an alkyl group, an aryl group, an aralkyl group, a halogenated alkyl group, a halogenated aryl group, a halogenated aralkyl group, an alkenyl group, an alkoxyaryl group, an acyloxyaryl group, or a combination of them, $R^6$ may be independently selected from an alkyl group, an aryl group, an aralkyl group, a halogenated alkyl group, a halogenated aryl group, a halogenated aralkyl group, an organic group having an epoxy group, a mercapto group, an alkoxyaryl group, an acyloxyaryl group, a hydroxy group, a cyclic amino group, or a cyano group, or a combination of them.

$R^2$ may be an alkoxy group, an acyloxy group, or a halogen group, y is an integer of 0 to 2, n is an integer of 1 to 3, and z is an integer of 0 to 11, wherein the total value of y+n+z may not exceed 4.

In the structure of Formula IV, x denotes the value that the spacer group $R^3$ can encompass and must be equal to or greater than 1.

In one embodiment, Formula IV comprises a silicon species with free or protected aliphatic or phenolic hydroxy groups.

In one embodiment, Formula IV comprises a silicon species with free or protected aliphatic or phenolic carboxylic acid groups.

The present invention finally relates to the compositions comprising a copoly(organosiloxane) obtained by hydrolyzing a first silicon compound having the general formula II, with a precursor having the general formula V $$R^7_p\text{-}MR^8_q \quad (V)$$

wherein $R^7$ can be independently selected from an alkyl group, an aryl group, an aralkyl group, a halogenated alkyl group, a halogenated aryl group, a halogenated aralkyl group, an alkenyl group, an alkoxyaryl group, an acyloxyaryl group, or a combination of them, M can be independently chosen from any metal capable of forming precursors that can be hydrolyzed and condensed to metal oxides or metal-oxohydroxides, p is an integer of 0 to 1 and requires that M is capable of forming stable carbon metal bonds, q is an integer of a number obtained from $M_{ox}$-p, wherein $M_{ox}$ is the oxidation state of the metal precursor and p is the number of carbon radicals $R^7$ covalently attached to the metal precursor, $R^8$ may be an alkoxy group, an acyloxy group, a halogen group, a hydroxy group or an oxygen atom functioning as a linkage to another metal atom; or $R^8$ may also consist of bidente or coordinating ligands of a metal.

In the present context,

"alkyl group" stands for $C_{1-10}$ alkyl groups, in particular $C_{1-4}$ alkyl groups;

"alkoxy group" stands for $C_{1-10}$ alkoxy groups, in particular $C_{1-4}$ alkoxy groups;

"aryl group" stands for aromatic ring groups having 1 to 5 rings, fused or conjugated, and having 4 to 30 carbon atoms.

"aralkyl group" stand for aromatic ring groups having 1 to 5 rings and 4 to 30 carbon atoms and bearing as ring substituents 1 to 6, in particular 1 to 3 alkyl groups each having 1 to 10, in particular 1 to 4 carbon atoms, "alkoxyaryl" stands for aryl groups having 1 to 5 rings and 4 to 30 carbon atoms and bearing 1 to 6 alkoxy groups as ring substituents, wherein the alkoxy groups have 1 to 10, preferably 1 to 4 carbon atoms, and "acyloxyaryl" stands for aryl groups having 1 to 5 rings and 4 to 30 carbon atoms and bearing 1 to 6 acyloxy groups as ring substituents, wherein the acyloxy groups contain 1 to 4 carbon atoms.

Examples of halogen substituents comprise fluoro, chloro, bromo and iodo groups.

Typically, the metal compounds of formula V are metal β-diketones or β-ketoesters or combinations thereof.

The metals in the meaning of "M" are typically selected from the group of transition and rare earth metals. Examples of metals include the following: antimony, bismuth, germanium, hafnium, iron, molybdenum, cerium, lanthanum, yttrium, tin, titanium, zirconium and tungsten, having various oxidation degrees, for example zirconium, hafnium, aluminium, titanium and tin and combinations thereof.

In particular, the metals can be selected from the group of antimony(II), bismuth(II), germanium, hafnium(IV), iron (III), molybdenum(V), cerium(IV,) lanthanum(II), yttrium (III), tin(IV), titanium(IV), zirconium(IV) and tungsten(V).

Specific examples of precursor II include, but are not limited to, tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltriethoxysilane, methyltrichlorosilane, methyltriacetoxysilane, methyltripropoxysilane, methyltributoxysilane, methyltriphenoxysilane, methyltribenzyloxysilane, ethyltrimethoxysilane, ethyltriethoxysilane, phenyltrimethoxysilane, phenyltrichlorosilane, phenyltriacetoxysilane, phenyltriethoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl) ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl) propyltriethoxysilane, 5-(3,4-epoxycyclohexyl)butyltrimethoxysilane, 6-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, and phenylsulfonylaminopropyltriethoxysilane.

Specific examples of precursor III include, but are not limited to, 4-acetoxyphenylethyltrichlorosilane, 4-acetoxyphenylethyltrimethoxysilane, 4-acetoxyphenylethyltriethoxysilane 4-(acetoxyphenylethyl)methyldichlorosilane, 4-(acetoxyphenylethyl)methyldimethoxysilane, 4-(acetoxyphenylethyl)methyldiethoxysilane, triethoxysilylpropylcarbamate, triethoxysilylpropylmaleamic acid, N-(3-triethoxysilylpropyl)-4-hydroxybutyramide, N-(3-triethoxysilylpropyl)gluconamide, (3-triethoxysilyl)propylsuccinic anhydride, ureidopropyltriethoxysilane, ureidopropyltrimethoxysilane, 3-hydroxy-3,3-bis(trifluoromethyl)propyl triethoxysilane, 4-(methoxymethoxy)trimethoxysilylbenzene and 6-(methoxymethoxy)-2-(trimethoxysilyl)naphthalene.

Specific examples of precursor IV include but are not limited to antimony(III)alkoxides such as antimony(III) ethoxide, bismuth(III)alkoxides such as bismuth(III)isopropoxide, germaniumalkoxides such as tetraethoxygermane, hafnium(IV)alkoxides such as hafnium(IV)butoxide, iron(III)alkoxides such as iron(III)ethoxide, molybdenum (V)alkoxides such as molybdenum(V)ethoxide, cerium(IV) alkoxides such as cerium(IV)isopropoxide, lanthanium(III) alkoxides such as lanthanium(III)isopropoxide, yttrium(III) alkoxides such as yttrium(III)isopropoxide, tin(IV) alkoxides, alkyl- and aryl substituted tin(IV)alkoxides such as tetra-t-butoxytin, tetra-i-propoxytin, titanium(IV) alkoxides such as titanium(IV)butoxide and titanium(IV)isoprpoxide, zirconium(IV) alkoxides such as zirconium(IV)butoxide, tungsten(V)alkoxides and tungsten(VI)alkoxides such as tungsten(V)ethoxide and tungsten(VI)ethoxide.

In one embodiment, a method of making partially condensed polyhydridosilsesquioxane resins comprises using HTEOS ($HSi(OC_2H_5)_3$) or mixture of HTEOS and other trifunctional silanes, which are subjected to a controlled hydrolytic/condensation reaction.

In such a method, trifunctional silanes are typically selected from methyltrimethoxysilane (MTMOS), methyltriethoxysilane (MTEOS), trimethoxyethylsilane (ETMOS) or diethoxydimethylsilane (DMDEOS) or trimethoxyphenylsilane (PhTMOS).

In an embodiment, the monomers are dissolved in MeOTHF which is used as solvent for the synthesis. Alternatively, other solvents such as EtOTHF or mixture of MeOTHF and EtOTHF, or a synthesis solvent of MeOTHF, EtOTHF, or R-OTHF where R consists of 3 to 12 carbons, is used.

In one embodiment, controlled hydrolysis of the monomers is obtained with acid solutions with molar ratio ranging from 0.0001 M to 1 M.

According to one embodiment, the hydrolysis and polymerization is carried out completely without solvents, or it is carried out in organic solvents, such as in alcohols, esters, ketones and ethers.

Specific, suitable solvents are acetone, ethyl methyl ketone, methanol, ethanol, isopropanol, butanol, methyl acetate, ethyl acetate, propyl acetate, butyl acetate and tetrahydrofuran. Particularly suitable solvents are ketones and ethers, particularly where certain stabilizing effect through coordination with the silicon atoms during hydrolysis is present. Such examples are ethyl methyl ketone, methyl tetrahydrofurfuryl ether and ethyl tetrahydrofurfuryl ether.

Controlled hydrolysis of the monomers is obtained by addition of an acid or base solution with molar ratio ranging from 0.0001 M to 1 M.

An organic or inorganic acid can be used in the synthesis.

Inorganic acids such as nitric acid, sulfuric acid, hydrochloric acid, hydroiodic acid, hydrobromic acid, hydrofluoric acid, boric acid, perchloric acid, carbonic acid and phosphoric acid can be used. Preferably, nitric acid or hydrochloric acid is used due to their low boiling point, which makes purification of product simple.

In other option, various organic acids can be used instead of inorganic acid. Organic acids are carboxylic acid, sulfonic acid, alcohol, thiol, enol, and phenol groups. Examples are methanesulfonic acid, acetic acid, ethanesulfonic acid, toluenesulfonic acid, formic acid, or oxalic acid.

Bases used in the synthesis may similarly be inorganic or organic. Typical inorganic bases and metal hydroxides, carbonates, bicarbonates and other salts that yield a alkaline water solution. Examples of such materials are sodium hydroxide, potassium hydroxide, cesium hydroxide, calcium hydroxide, sodium carbonate, and sodium bicarbonate. Organic bases on the other hand comprise a larger group consisting of metal salts of organic acids (such as sodium acetate, potassium acetate, sodium acrylate, sodium methacrylate, sodium benzoate), linearm branched or cyclic alkylamines (such as diaminoethane, purtescine, cadaverine, triethylamine, butylamine, dibutylamine, tributylamine, piperidine) amidines and guanidines (such as 8-diazabicyclo (5.4.0)undec-7-ene, 1,1,3,3-tetramethylguanidine, 1,5,7-triazabicyclo[4.4.0]-dec-5-ene), phosphazanes (such as $P_1$-t-Bu, $P_2$-t-Bu, $P_4$-t-Bu), and quaternary ammonium compounds (such as tetramethylammonium hydroxide, tetraethylammonium hydroxide, tetrabutylammonium hydroxide).

The reaction mixture during the hydrolysis and condensation process can be maintained at a temperature in the range from −30° C. to 170° C.

Those familiar to the art know that lower reaction temperatures provide improved control of the reaction but at the cost of long reaction times, while excessively high temperatures may make the process too fast for adequate control.

A reaction time of 1 to 48 h, or 2-24 h, at a temperature of 0-100° C. is preferred.

The method according to the present invention yields a partially cross-linked, optionally metal containing organosiloxane polymer in an organic solvent system, said polymer having a molecular weight of about 5,00 to 100,000 g/mol, in particular about 1,000 to 50,000 g/mol, measured against polystyrene standards.

Another embodiment of the invention is that the solvent in which hydrolysis and polymerization is carried out, is after polymerization changed for a solvent that provides the material better coating performance and product storage properties though some form of stabilization.

Stabilizing organic solvent systems are for example formed by an organic ether optionally in mixture with other co-solvent or co-solvents.

In one embodiment, the organic ether is a linear, branched or cyclic ether comprising generally 4 to 26 carbon atoms and optionally containing other functional groups, such as hydroxyl groups.

Particularly suitable examples are five and six membered cyclic ethers, which optionally bear substituents on the ring.

Other suitable ethers are, for example, (C1-20) alkanediol (C1-6) alkyl ethers. Examples of said alkanediol alkyl ethers are propylene glycol monomethyl ether, propylene glycol dimethyl ether, propylene glycol n-butyl ether, dipropylene glycol monomethyl ether, dipropylene glycol. dimethyl ether, dipropyleneglycol n-butyl ether, tripropylene glycol monomethyl ether and mixtures thereof.

Particularly preferred examples of the present ethers are methyl tetrahydrofurfuryl ether, tetrahydrofurfuryl alcohol, propylene glycol n-propyl ether, dipropylene glycol dimethyl ether, propylene glycol n-methyl ether, propylene glycol n-ethyl ether and mixtures thereof.

The stabilizing solvent system consists of a solvent comprising an ether of the above-identified kind alone, or a mixture of such ether(s) with a typical reaction medium of the hydrolyzation or other solvents such as propylene glycol monomethyl ether acetate. The proportion of the ether is, in such a case, about 10 to 90 wt-%, in particular about 20 to 80 wt-% of the total amount of the solvent.

The solid content of the radiation sensitive formulation consisting of selected solvents and the resin material is in the range of 0.1% to no more than 50%, preferably in the range of 0.5% to 10%.

In one embodiment, in condensed polyhydridosilsesquioxane resins, the formulations are combined with different photoacid generators and photobase generators and sensitizer to be used as EUVL negative tone resists.

The solid content (or polymer content) is used to adjust the resultant film thickness during the coating process.

To improve the coating performance in terms of coating uniformity, different surfactants such as silicone or fluoro surfactant can be used can be used to lower surface tension of the silanol-containing polyhydridosilsesquioxane formulation coating. The use of such surfactants may improve coating quality if needed. The amount of surfactant is in a range of 0.001% to no more than 10% by mass compared to silanol-containing polyhydridosilsesquioxane amount.

The compositions may also contain salts, in particular inorganic salts.

In one embodiment, the siloxane prepolymer solutions have a viscosity from about 0.5 centipoises (cP) to about 150 cP. The organic liquid can have a flash point of at least 10° C. and a vapor pressure at 20° C. of less than about 10 kPa.

As discussed above, the radiation sensitive metal and silanol containing polyhydridosilsesquioxane compositions described herein can be used for the direct formation of desired inorganic material structures within the device and/or as a radiation patternable inorganic resist that is a replacement for an organic resist. In either case, significant processing improvements can be exploited, and the structure of the patterned material can be also improved.

The presence of silanol moieties in the HSQ resin greatly improves the pattern forming ability of the coatings compared to HSQ resins.

Metal and silanol containing polyhydridosilsesquioxane solutions, generally in non-aqueous solvent provide high resolution patterning in which the solutions have a high degree of stability for the formation of radiation patternable coatings with good radiation sensitivity.

Coatings formed with the metal and silanol containing polyhydridosilsesquioxane solutions provide for superior direct patterning for the formation of a patterned silicon oxide coating. In embodiments of interest, exposure to radiation converts the irradiated coating material into a material that is resistant to removal with a developer composition such that it can be selectively removed.

Thus, the coating can be negatively patterned. Selective removal of at least a portion of the coating material can leave a pattern where regions of coating have been removed to expose the underlying substrate. After development of the coating following irradiation, the patterned silicon oxide materials can be used for facilitating processing in device formation with excellent pattern resolution. The coating materials can be designed to be sensitive to selected radiation, such as extreme ultraviolet light, ultraviolet light and/or electron beams. Furthermore, the precursor solutions can be formulated to be stable with an appropriate shelf life for commercial distribution.

The radiation sensitive coating material can be used as negative radiation patterning coating. In the negative patterning, exposure to radiation converts the irradiated coating material into a material that is more resistant to removal with a developer composition relative to the non-irradiated coating material. Selectively removal of at least a portion of the coating material leaves a pattern where regions have been removed to expose the underlying substrate.

The formation of integrated electronic devices and the like generally involves the patterning of the materials to form individual elements or components within the structures. This patterning can involve different compositions covering selected portions of stacked layers that interface with each other vertically and/or horizontally to induce desired functionality.

The various materials can comprise semiconductors, which can have selected dopants, dielectrics, electrical conductors and/or other types of materials. To form high resolution patterns, radiation sensitive organic compositions can be used to introduce patterns, and the compositions can be referred to as resists since portions of the composition are processed to be resistant to development/etching such that selective material removal can be used to introduce a selected pattern.

Radiation with the selected pattern or the negative of the pattern can be used to expose the resist and to form a pattern or latent image with developer resistant regions and developer dissolvable regions.

Figure 4:
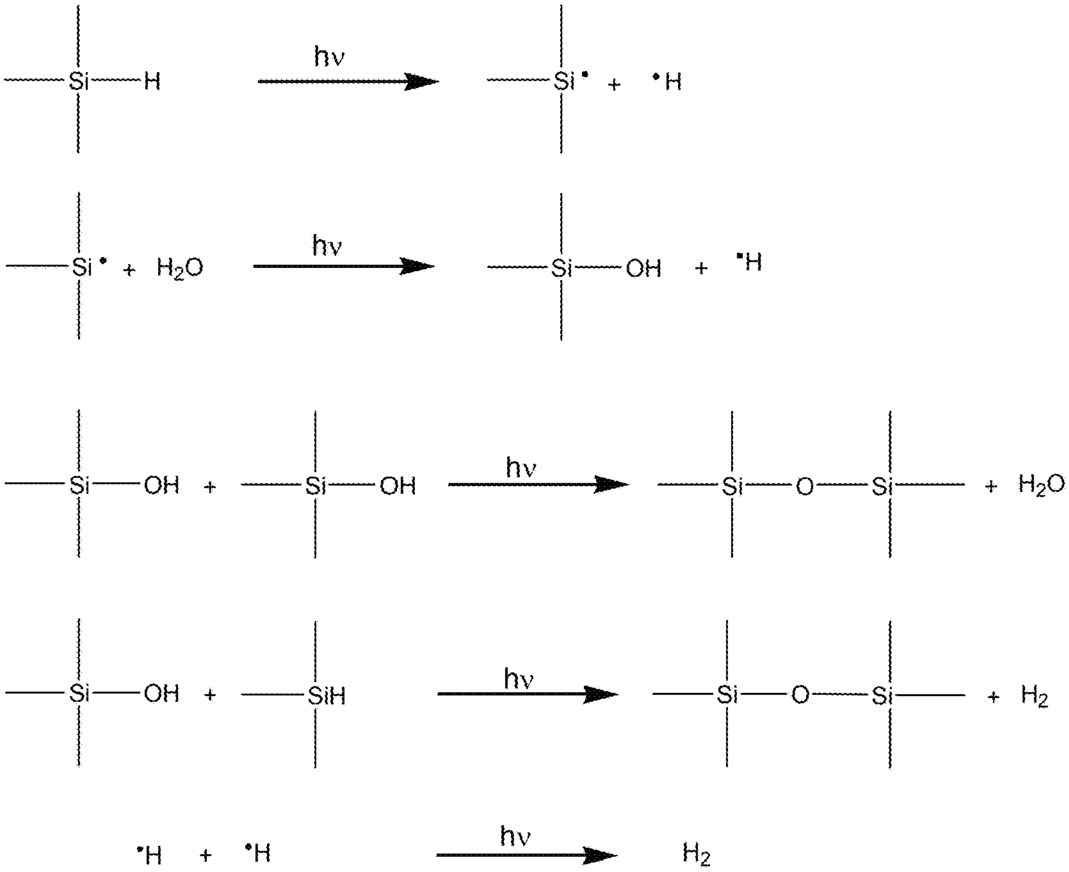
FIG. 4 shows the EUV crosslink mechanism of the silanol-containing polyhydridosilsesquioxane.

During EUV or similar irradiation method such as e-beam, SiH species react to form an intermediate, reactive silicon species (FIG. 4). This intermediate requires atmospheric moisture or increased doses for subsequent reactions. In fact, many metal resist proposed for EUVL exhibit similar challenges where reactive intermediates require atmospheric moisture for subsequent reactions that crosslink the material yielding a negative tone resist coating material. Thus, our finding to introduce a suitable amount of silanol groups in the film which directly react with intermediate reactive silicon species generated by EUV from SiH.

As the result, a silanol-containing polyhydridosilsesquioxane demonstrates higher sensitivity in EUV lithography compared to those described in literature to date.

Based on the above, the present technology provides for the forming of a resist film by application of a composition as described above for forming a resist underlayer film onto a semiconductor substrate and baking the composition.

In one embodiment, there is provided a method for producing a semiconductor device, comprising:

- applying a resist underlayer film or several underlayer films onto a semiconductor substrate and baking the composition to form one or more resist underlayer films;
- applying a composition according to claim 1 as a resist onto one or more resist underlayer films to form a resist film;
- exposing the resist film to light;
- after the light exposure, developing the resist film to form a resist pattern;
- etching the resist underlayer film using the resist pattern; and
- fabricating the semiconductor substrate using the resist film thus patterned and the resist underlayer film thus patterned.

In one embodiment, there is provided a method for producing a semiconductor device, comprising:

- forming an organic underlayer film on a semiconductor substrate;
- applying the composition for forming a resist film onto the organic underlayer film and baking the composition to form a resist film;
- exposing the resist film to light;
- after the light exposure, developing the resist film to form a resist pattern;
- etching the resist underlayer film using the resist pattern;
- etching the organic underlayer film using the resist underlayer film thus patterned; and
- fabricating the semiconductor substrate using the organic underlayer film thus patterned.

The technology also provides for a method of producing a semiconductor device, the method comprising:

- applying a resist underlayer film or several underlayer films onto a semiconductor substrate and baking the composition to form one or more resist underlayer films;
- applying a composition according to claim 1 as a resist onto one or more resist underlayer films to form a resist film;
- exposing the resist film to light;
- after the light exposure, developing the resist film to form a resist pattern;
- etching the resist underlayer film using the resist pattern; and
- fabricating the semiconductor substrate using the resist film thus patterned and the resist underlayer film thus patterned.

Further, a method for producing a semiconductor device comprises the steps of

- forming an organic underlayer film on a semiconductor substrate;
- applying the composition for forming a resist film onto the organic underlayer film and baking the composition to form a resist film;
- exposing the resist film to light;
- after the light exposure, developing the resist film to form a resist pattern;
- etching the resist underlayer film using the resist pattern;
- etching the organic underlayer film using the resist underlayer film thus patterned; and
- fabricating the semiconductor substrate using the organic underlayer film thus patterned.

The composition of the coating has significant impact also on other attributes required for EUVL resist materials. A sufficiently long post coating delay (PCD) is necessary for practical reasons. Unlike previously used lithography steppers and scanners, which use ambient or nitrogen blankets during irradiation, EUVL scanner irradiation takes place in vacuum. Transfer from an interfaced or standalone resist track through various chambers in the EUVL scanner may take a long time so therefore the coating composition should be stable during these steps in the gas evacuation chambers.

Thus, a material should exhibit a sufficient PCD stability meaning that the coating can be readily removed using solvents or developer without leaving any residues on the substrate. Surprisingly, it has been found that a correlation between the Si—H and Si—OH in the film has an impact on the PCD stability. A too high Si—OH content in the film will make the material prematurely crosslink making development of unexposed areas impossible if the cure time in a patterning process would be too long. FTIR is a fast an easy tool to assess the Si—H to Si—OH ration and we observed that with certain rations the material yields high resolution patterns, low LER and good PCD stability.

Figure 7:
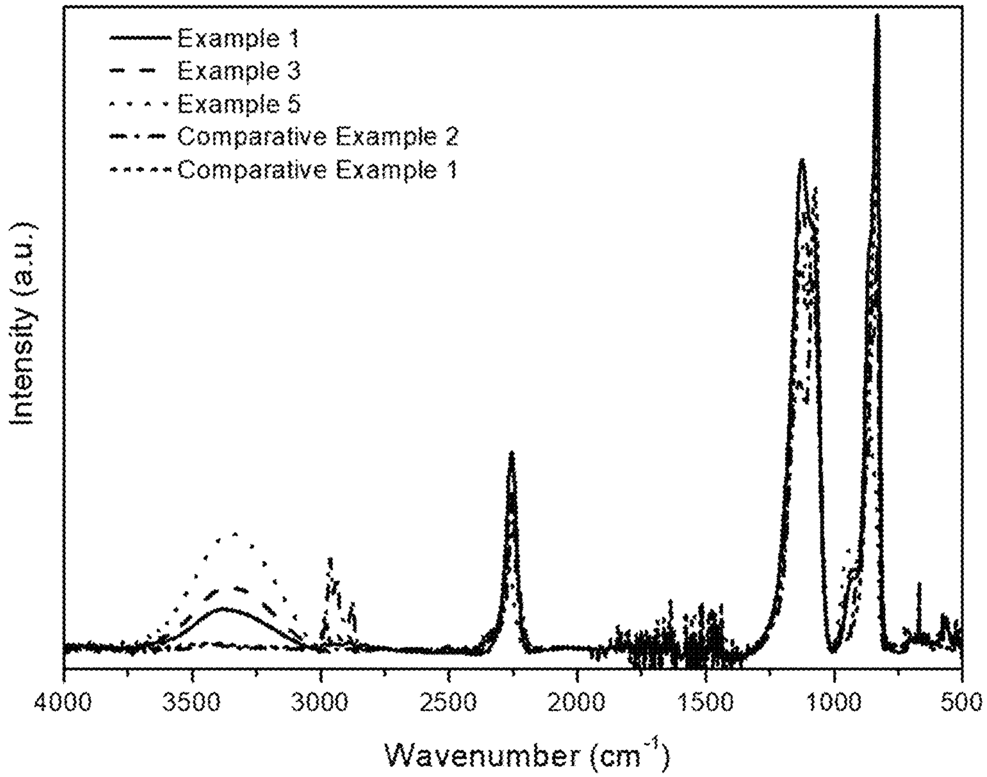
FIG. 7 shows the FTIR spectra of films prepared from polymers in Examples 1, 3, and 5, and comparative examples 1 and 2, indicating the differences in silanol content for different syntheses.

More specifically, FTIR spectra have been recorded to verify the chemical structure of synthesized silanol-containing polyhydridosilsesquioxane, which is presented in FIG. 7.

As can be seen in this figure, the silanol-containing polyhydridosilsesquioxane exhibits a strong and broad Si—OH peak ranging from 3200 to 3700 $cm^{-1}$, which is due to the hydrogen-bonded silanol network. In addition, Si—H functionality is seen as a sharp peak centered at around 2248 $cm^{-1}$. Thus, preferably the ratio of the Si—H to Si—OH peak height ratio should be at least, or preferably more than 4:1 but at the most or less than 100:1, or more preferably more than 3:1 but less than 50:1.

The present invention relates to the use of described compositions in the formation of patterns on a semiconductor substrate.

Turning next to the drawings, FIG. 1 shows a typical process, currently used, in which a substrate surface 10 is coated with an organic underlayer 12, followed by coating and curing of an inorganic middle layer 14, which typically consist of a high silicon containing material. On top of this, a photoresist 16 is coated.

After commonly known irradiation 18 using 193 nm wavelengths a pattern is formed and developed. Such a combination of layers is frequently described in the literature as a 'tri-layer' stack, referring to the number of layers.

Subsequent commonly known and used pattern transfer etch processes can be applied to transfer the pattern formed on the photoresist to the substrate (FIG. 1).

It is worth noting that the stack of various layers used in lithography can be higher than 3.

Figure 2:
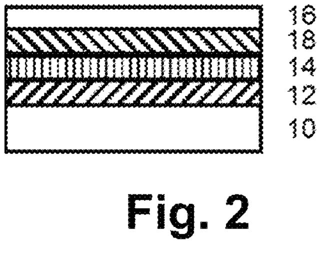
FIG. 2 shows in a schematic fashion, in side-view, the assembly of a four-layer lithography stack.

Another commonly used combination of layers is a four-layer stack (cf. FIG. 2) wherein an organic underlayer (or substrate) 12 is first applied, followed by coating and curing of an inorganic middle layer 14, which typically consist of a high silicon containing material. On top of this, an organic bottom anti-reflective 18 layer is applied prior to a photoresist 16 which completes the four-layer stack of FIG. 2.

Those familiar to the art of underlayer materials used in photoresist patterning know that all described underlayers can not only be coated and cured but also be applied by gas phase deposition processes such as chemical vapor deposition (CVD), atomic layer deposition (ALD) and similar methods.

For those familiar to the art, the same procedure can be applied to EUVL at 13.5 nm.

However, due to absorption challenges, stochastic distribution of both photo acid and the photon irradiation, common CAR used in the process faces serious challenges, in particular related to the LER and LWR.

Therefore, a significant amount of interest has been directed to the use of inorganic photoresists which promise the stack simplification where both number of layers are reduced and the LER and LWR challenges are reduced. In most cases the inorganic resist consists of metal oxides of one or more compounds in the form of readily hydrolysable or hydrolyzed metal oxide precursors, and hydrogensilsesquioxanes. The benefits of these have been: metal oxide resist yield an unprecendented EUVL dose sensitivity while hydrogensilsesquioxane polymers give excellent resolution with low LER/LWR with very poor EUVL sensitivity.

Thus, both methods have attributes which render them challenging to use in EUVL patterning processes.

Figure 3:
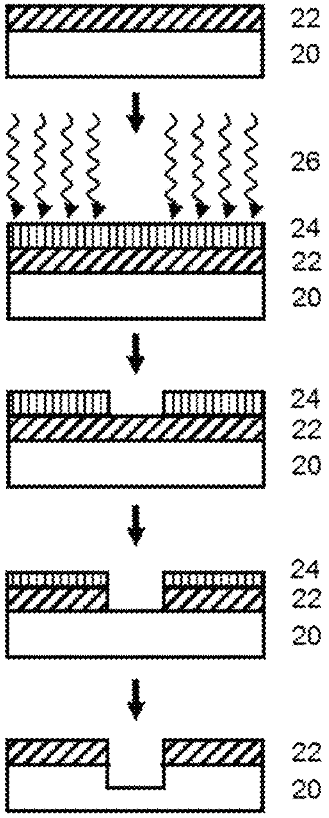
FIG. 3 shows in a schematic fashion, in side-view, patterning with metal and hydroxy containing polyhydrogensilsesquioxane resin according to one embodiment.

The present invention uses metal-silanol containing siloxanes as the preferred method to achieve both stack simplification and the reduction of metals used in the patterning process, cf. FIG. 3.

In an embodiment of the present invention, a substrate 20 is coated with a predominately organic coating 22 in the form of a spin on carbon or an amorphous carbon layer in EUV.

The thin, patternable film according to the present invention 22 is based on metal and silanol containing polyhydridosilsesquioxane resin 24.

This coating is readily patternable by EUVL with high sensitivity compared to HSQ resins in the literature and significantly lower LER/LWR compared to CAR and inorganic resins described in the literature.

In particular, the present invention provides a mean to high resolution patterning with a bilayer structure in the absence of metals which may be a significant advantage in producing fully functional transistor dies without significant yield losses. It is well known that silicon containing materials have relatively low absorption to EUV. On the other hand, it has been established that the EUV generates unstable silanols from Si—H moieties in HSQ resins of FIG. 4.

Based on the examples presented herein, it is evident that also metal containing additives which facilitate silanol condensation or SiH oxidation will be of benefit to achieve lower sensitivity compared to methods described in the literature.

The improvement can be obtained by 1. increased sensitivity of the resin compared to silicon containing resin only or
2. accelerated condensation process compared to non-metal containing formulation The present invention is realized by deposition of a carbon rich underlayer 22 on a surface 20 used in manufacturing of integrated circuits. The underlayer is deposited by gas phase processes such as CVD or by spin coat and cure. Then a composition following the present invention is applied 24 yielding a predominately silicon and metal rich oxide coating which can be directly patterned by novel patterning techniques such as EUVL.

After application by spin coating or other suitable deposition methods for liquids, a prebake step is applied to remove the solvents and volatile compounds which are included in the coating material. This is necessary to avoid contamination in the manufacturing equipment.

Prebake can be done at different temperatures and times depending on the boiling temperature of the solvents and volatile components. Usually, prebake can be done at 60° C. to 120° C. for a period of 30 seconds and up to no more than 30 minutes.

After the drying or prebake step, exposure of the coating to EUV light, electron beam or similar exposure method (26) through an optionally used mask is used to generate the patterns on the substrate. The dose needed to generate patterns is at minimum 10 $mJ/cm^2$ and at maximum 200 $mJ/cm^2$.

As noted previously, a lower dose is preferred due to various reasons among which include a reasonable throughput in industrial application and addressing the RLS trade off. A post exposure bake is optionally carried out after EUV exposure. This step can improve the crosslinking of the exposed regions which would lead to higher contrast of the resist. Post exposure bake can be done in a temperature of 80° C. and up to no more than 150° C. for a time ranging from 30 seconds and up to no more than 30 minutes.

Development is carried out to remove the unexposed region, thus obtaining designed pattern. During the development step, non-exposed regions of the resist 24 dissolves in the developer.

Aqueous base developer commonly used in the industry based on bases such as tetramethylammonium hydroxide, potassium hydroxide, sodium hydroxide with different mass ratio of 0.1% to 25% can be effectively used. The development is carried out commonly known methods using a spray or puddle of the developer solution method to apply the developer. Alternatively, the substrate can be immersed in bath consisting of the developer.

A curing step to densify the exposed and developed pattern may be optionally carried out to obtain a further crosslinked material or to alter the shape of the resist pattern through process where the material exhibits some reflow. This step may result in higher etch resistance material compared to that of material prepared without the curing step. Curing can be done at 120° C. to 400° C. for 2 minutes and up to no more than 30 minutes. Curing can be done by heating the coating placed on a hot plate or in an oven.

Different photoacid generators (PAG), photobase generators (PBG), and sensitizer may be added in the radiation sensitive coating formulations. Such additives are the key component in CARs and their stochastic distribution a frequent root cause for LER challenges in resist formulations.

Generally, photoacid generators and photobase generators can be selected from non-ionic acid generators and photobase generators of the non-ionic base type or ionic type. The photobase generators can be used in combination with a sensitizer.

Surprisingly, an increase in LER was not observed as a function of PAG or PBG did neither decrease required doses nor increase the LER due to stochastic distribution challenges and shot noise during exposure. Nevertheless, PAG or PBG may be added to coating formulations to enhance the acid or base catalyzed condensation of the radiation sensitive coating to facilitate condensation of the exposed areas of the film yielding potentially more densified patterns.

A great variety of PAG, PBG and sensitizers are available. To give an example of few, PAGs include ionic photoacid generators such as aryldiazonium salts, diarylhalonium salts, triarylsulfonium salts, etc. The amount of ionic photoacid generators is in a range of 0.001% to no more than 10% by mass compared to the amount of silanol-containing polyhydridosilsesquioxane.

Different photoacid generators include non-ionic acid generators such as nitrobenzyl esters, sulfones, phosphates, n-hydroxyimide sulfonates, sulfonic acid esters of phenol, diazonaphthoquinones, halogen-containing compounds, imino sulfones. The amount of non-ionic photoacid generators is in a range of 0.001% to no more than 10% by mass compared to silanol-containing polyhydridosilsesquioxane amount.

Photobase generators can be Co(III)-amine and alkyl amine salts, O-acyloximes, benzyloxycarbonyl derivatives, formamides can be added. The amount of Photobase generators is in a range of 0.001% to no more than 10% by mass compared to silanol-containing polyhydridosilsesquioxane amount.

Figure 8:
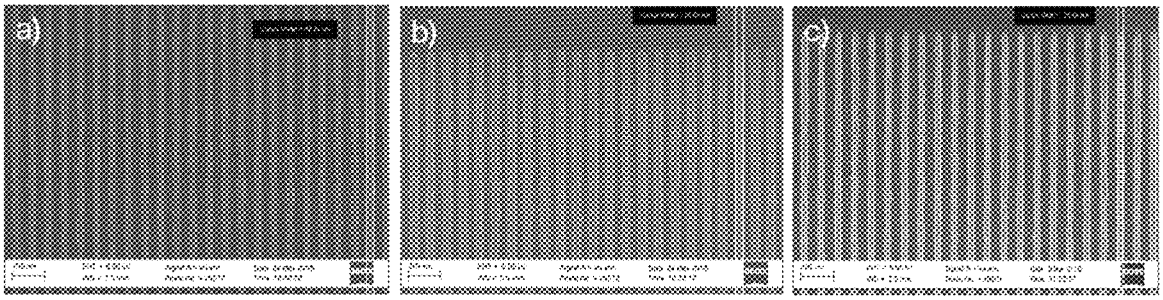
FIG. 8 comprises three SEM images demonstrating the e-beam results of a) Example 1, b) Example 7, and c) Example 10 after radiation; as will be apparent from FIG. 8, in Examples 7 and 10, the required dose was 40% than in Example 1 to obtain similar patterns with improved LER.

We confirmed this theory by EUV lithography and the scanning electron microscope (SEM) images of the patterns are presented in FIG. 8.

As mentioned in Example 1, the polymer 1 with a 2% solid content was used to prepare the film, which was irradiated with EUV and finally developed with 2.38% TMAH to obtain patterned image. As seen in FIG. 8, high resolution SEM images of different half pitches of 22 nm, 30 nm, and 50 nm have been obtained, for examples, at doses of 65.4 $mJ/cm^2$ 86.5 $mJ/cm^2$, and 82 $mJ/cm^2$, respectively.

Figure 9:
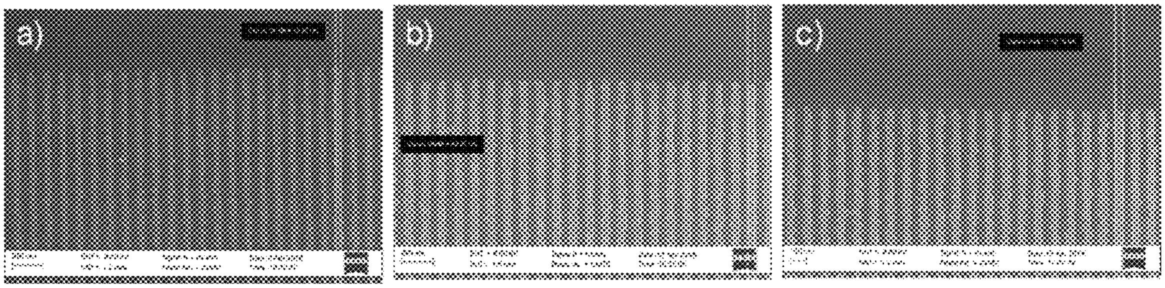
FIG. 9 contains three SEM images demonstrating the e-beam results of a) Example 1, b) Example 14, and c) Example 17; as will be apparent from FIG. 9, the required dose to obtain pattern decreased in b) by 17% and c) by 33%.

Moreover, we further confirmed our theory using e-beam lithography. We used three formulations at different contents of polymer made in Example 1, which are 1%, 2%, and 3%. The SEM images in FIG. 9 show that 50 nm line of patterns have been obtained at 600 $\mu C/cm^2$, 400 $\mu C/cm^2$, and 200 $\mu C/cm^2$. As seen, higher sensitivity was observed for samples with higher solid content. This is because of higher content of silanol in the film which increase the density and reactivity of crosslink.

However, when the ratio of SiH to SiOH is less than 4, the silanol amount in the film is becomes too large, as seen in samples 3 and 5. The high silanol content leads to a material which does not exhibit a PCD suitable for EUV (FIG. 5-6 and Table 1), as the coating self-crosslinks relatively rapidly and is no longer possible to remove with the developer. On the other hand, if the ratio of SiH to SiOH is more than 100, the sensitivity of the film reduces significantly and therefore require large amount of EUV dose.

Thus, we extensively investigated the synthesis approach to adjust the amount of SiH/SiOH ratio in the resin by using different hydrolysis time, and/or carried out the reaction in different solvents, and/or using different monomer ratios. The FTIR result is presented in FIG. 7.

In real EUV lithography application, post coating delay (PCD) of the EUV resist film after soft bake needs to be at least 1 hour. Therefore, we extensively conducted PCD test for our developed polymers and formulations. The procedure was summarized in summarized in Table 1.

X is the mark given for a sample where the PCD is good for EUV lithography, while Y is only good at low soft bake temperature, 80° C. for 1 min in the examples, and Z is not acceptable at any soft bake temperature which is high enough to remove solvent in the film completely.

To improve the sensitivity further, metal oxide nanoparticles can be added into the polymer solution to be used as photoresists. Different metal oxide nanoparticles can be added such as titanium oxide nanoparticles, hybrid titanium aluminum oxide nanoparticles, or hafnium nanoparticles.

Figure 10:
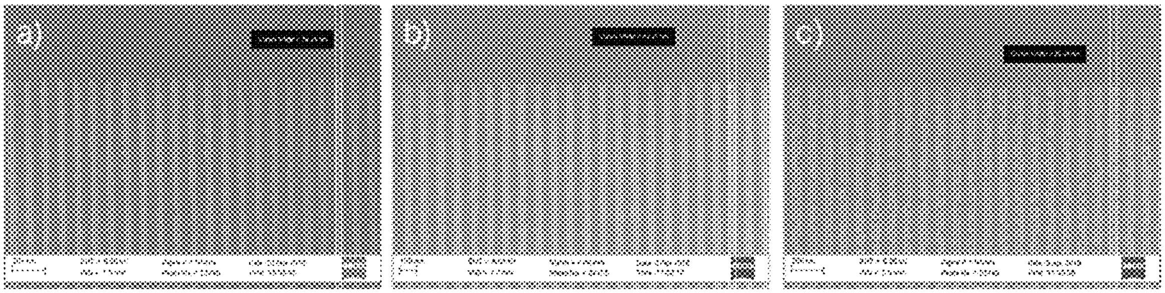
FIG. 10 contains three SEM images demonstrating the e-beam results of a) Example 1, b) Example 20 c) Example 21 showing the performance thereof at the same doses.

The results using e-beam lithography and result are presented in FIGS. 10*a*, 10*c*, and 10*d*. The addition of the nanoparticles may increase the sensitivity of the coating film via catalytic activity on the crosslink reaction of silanol and silanol with Si—H. Another benefit is that metal oxide included in the film may improve etch resistivity or etch selectivity in plasma etching during microelectronic manufactures. In addition, it has been found that an addition of solubility enhancer such as HFIPTEOS with only 2.5 wt-% in to the polymer 1 increase the line edge roughness significantly (SEM image in FIG. 8*c*).

Based on the above, the following embodiments are provided:

A precursor solution comprising an organic liquid and from about 0.001M to about 1M silanol compared to Si—H or Si—R in silicon-oxygen network, or silicon-oxygen-metal with silicon-carbon bonds and silicon-hydrogen, and the precursor solution having a viscosity from about 0.5 centipoises (cP) to about 150 cP. The organic liquid can have a flash point of at least 10° C. and a vapor pressure at 20° C. of less than about 10 kPa.

A method for patterning a metal and silanol containing polyhydridosilsesquioxane coated substrate with radiation of light at a specific wavelength, the method comprising the steps of irradiating a coated substrate along a selected pattern to form an irradiated structure with a region of irradiated coating and a region with un-irradiated coating and selectively developing the irradiated structure to remove a substantial portion of the un-irradiated coating to form a patterned substrate.

A method for patterning a metal and silanol containing polyhydridosilsesquioxane coated substrate with radiation of light at a specific wavelength, wherein the wavelength is 13.5 nm or less.

A coated substrate comprising a radiation sensitive coating having an average thickness of no more than about 5 microns and a thickness variation of no more than about 50% from the average at any point along the coating, the coating comprising a silicon-oxygen, or silicon-oxygen-metal network with silicon-carbon bonds and silicon-hydrogen and/or with silanol bonds.

A patterned substrate comprising a substrate with a surface and a first coating at selected regions along the surface and absent at other regions along the surface. Generally, the first coating comprises a silicon-oxygen, or silicon-oxygen-metal network with silicon-carbon bonds and silicon-hydrogen and/or with silanol bonds. Alternatively, the first coating is soluble in at least some organic liquids, or the first coating is soluble in aqueous bases.

A patterned substrate comprises a substrate with a surface and a first coating at selected regions along the surface and absent at other regions along the surface. Generally, the first coating comprises a silicon-oxygen, or silicon-oxygen-metal network with silicon-carbon bonds and silicon-hydrogen and/or with silanol bonds, and has an etch rate in an oxygen plasma or ashing process lower than 50 nm/min.

The following non-limiting examples illustrate embodiments.

EXAMPLES

Gel permeation chromatography data was collected on an Agilent 1260 Infinity LC equipped with Shodex KF columns (KF-G; KF-803L; KF-802; KF-801) connected in series. The detector and column temperature was held at 40° C. Flow rate of THF eluent was 1.0 ml/min.

Fourier transform infrared spectroscopy (FT-IR) was used to study the chemical structure using a Bruker VERTEX 70. The film samples were used for the analysis.

Post coating delay (PCD) test: polymer solution from examples was diluted with PGMEA to obtain a solution with 2% solid content. Film samples were prepared by spin coating the polymer solution on silicon wafers at 1500 rpm for 30 seconds. Soft bake was then carried out on a hot plate with temperature ranging from 80° C. to 150° C. for 1 minutes. The films were stored at room temperature for 1 h, which was then developed with 2.38% TMAH and finally washed repeatedly three times with deionized water and dried with nitrogen gas.

The film thicknesses before and after development were measured to evaluate PCD. If the film was totally removed by TMAH developer after soft bake, it was good at PCD. The result is summarized in Table 1.

E-beam lithography was carried out on a Vistec tool. The 2% solid formulations were spin coated on silicon wafers via a spin coater with a spinning speed of 1500 rpm for 30 seconds. Soft bake was then carried out on a hot plate at temperature of 80° C. for 1 minute. The e-beam doses were varied from 100 to 900 µC/cm2 at 100 kV and current of 1 nA. The development step was carried out by immersing the film in 2.38% TMAH solution for 1 minute. The film was then washed repeatedly three times with deionized water and finally dried with nitrogen gas.

EUV lithography: The polymer formulation of 2% solid content was spin coated on silicon wafers via a spin coater with a spinning speed of 1500 rpm for 30 seconds. Soft bake was then carried out on a hot plate at temperature of 80° C. for 1 minute. The film samples after soft bake were irradiated with a XIL-II EUV tool at Paul Scherrer Institute, Villigen, Switzerland. The doses were varied from 2 to 150 $mJ/cm^2$. The development step was carried out by immersing the film in 2.38% TMAH solution for 1 minute. The film was then washed repeatedly three times with deionized water and finally dried with nitrogen gas.

Example 1

In one flask an amount of 121.55 grams of triethoxysilane (HTEOS) was dissolved in 234.60 grams of methyl tetrahydrofurfurylether (MeOTHF). A mixture of 58.65 grams of MeOTHF, 25.62 grams of deionized water (DIW) and 11.71 grams of 0.01 mole nitric acid was mixed and added to the above HTEOS solution into three equal portions in 1.5 hours. After the completion of addition, the reaction was continued to mix for another 20 hours. Evaporation was carried out to obtain 21-25% of solid content. Methyl ethyl ketone (MEK) was added four times to the polymer weight. The obtained polymer solution was filtered with 0.2-micron filter. Gel permeation chromatography data shows Mw of 5001, Mn of 2239, and polydispersity of 2.23.

Etch data for the polymer of Example 1 is given in Table 1. Spin on carbon (SOC) used is SOC 300 manufactured by PiBond.

TABLE 1

Etch data for polymer made in Example 1.
RIE Etch

| gas | Bake ° C./1 min | Etch rate nm/min | Etch selectivity to SOC |
|---|---|---|---|
| $CF_4$ | 80 | 62 | 1:0.4 |
| | 150 | 62 | 1:0.4 |
| $O_2$ | 80 | 7.3 | 1:43 |
| | 150 | 4.7 | 1:66 |

Example 2

In one flask an amount of 121.55 grams of HTEOS was dissolved in 234.60 grams of ethyl tetrahydrofurfurylether (EtOTHF). A mixture of 58.65 grams of EtOTHF, 25.62 grams of DIW and 11.71 grams of 0.01 mole nitric acid was mixed and added to the above HTEOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with 0.2-micron filter. Gel permeation chromatography data shows Mw of 7396, Mn of 2903, and polydispersity of 2.54.

Example 3

In one flask an amount of 5.510 grams of HTEOS and 0.567 gram of tetramethoxysilane (TMOS) with molar ratio of 90:10 was dissolved in 11.730 grams of MeOTHF. A mixture of 2.932 grams of MeOTHF, 1.290 grams of DIW and 0.590 grams of 0.01 mole nitric acid was mixed and added to the above HTEOS and TMOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with 0.2-micron filter. Gel permeation chromatography data shows Mw of 4497, Mn of 2059, and polydispersity of 2.18.

Example 4

In one flask an amount of 5.223 grams of HTEOS and 0.854 gram of TMOS with molar ratio of 85:15 was dissolved in 11.729 grams of MeOTHF. A mixture of 2.930 grams of MeOTHF, 1.290 grams of DIW and 0.590 grams of 0.01 mole nitric acid was mixed and added to the above HTEOS and TMOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with 0.2-micron filter. Gel permeation chromatography data shows Mw of 2022, Mn of 1191, and polydispersity of 1.69.

Example 5

In one flask an amount of 3.154 grams of HTEOS and 2.293 grams of TMOS with molar ratio of 50:50 was dissolved in 11.729 grams of MeOTHF. A mixture of 2.930 grams of MeOTHF, 1.330 grams of DIW and 0.610 gram of 0.01 mole nitric acid was mixed and added to the above HTEOS and TMOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with 0.2-micron filter. Gel permeation chromatography data shows Mw of 3359, Mn of 1669, and polydispersity of 2.01.

Comparative Example 1

In one flask an amount of 60.77 grams of HTEOS was dissolved in 117.25 grams of ethanol. A mixture of 29.37 grams of ethanol, 6.40 grams of DIW and 2.93 gram of 0.01 mole nitric acid was mixed and added to the above HTEOS solution into three equal portions in 1.5 hours. After the completion of addition, the reaction was continued to mix for another 20 hours. Solvent exchanged was carried out by an addition of 250 grams of PGMEA and solvent evaporation was carried out to obtain 21-25% of solid content. MEK was added four times to the polymer weight. The obtained polymer solution was filtered with 0.2-micron filter. Gel permeation chromatography data shows Mw of 16598, Mn of 8432, and polydispersity of 1.97.

Comparative Example 2

In one flask an amount of 60.77 grams of HTEOS was dissolved in 117.25 grams of ethanol. A mixture of 146.60 grams of ethanol, 6.40 grams of DIW and 2.93 gram of 0.01 mole nitric acid was mixed and added to the above HTEOS solution into three equal portions in 1.5 hours. After the completion of addition, the reaction was continued to mix for another 20 hours. Solvent exchanged was carried out by an addition of 300 grams of 1-BuOH and solvent evaporation was carried out to obtain 21-25% of solid content. Methyl ethyl ketone (MEK) was added four times to the polymer weight. The obtained polymer solution was filtered with 0.2-micron filter. Gel permeation chromatography data shows Mw of 3188, Mn of 1967, and polydispersity of 1.62.

Testing of Polymers

The molecular weights of the polymers of Examples 14 to 18 on GPC and compared with the materials of Comparative Examples 1 and 2. Then film samples were prepared from the various polymers by spin coating the polymer solution, 2%, with a spinning speed of 1500 rpm for 30 seconds. Soft bake was then carried out with temperature ranging from 80° C. to 150° C. for 30 seconds to 2 minutes.

GPC data and data on post coating delay of the materials are given in Table 2.

TABLE 2

GPC data and post coating delay of the materials produced with different compositions.

| Example | GPC Mw/Mn | SIH:SiOH ratio in FTIR | Post coating delay 80° C. | 150° C. |
|---|---|---|---|---|
| Example 1 | 5001/2239 | 5.2 | X | X |
| Example 3 | 4497/2059 | | Z | Z |
| Example 4 | 2022/1191 | 2.4 | Z | Z |
| Example 5 | 3359/1669 | 0.7 | Z | Z |

TABLE 2-continued

GPC data and post coating delay of the materials produced with different compositions.

| Example | GPC Mw/Mn | SIH:SiOH ratio in FTIR | Post coating delay 80° C. | 150° C. |
|---|---|---|---|---|
| Comparative example 1 | 16598/8432 | 33.4 | X | X |
| Comparative example 2 | 3188/1967 | 48.2 | X | X |

Legends (for PCD results):
X = good for at least 1 h of PCD after bake at 80° C./1 h and 150° C./1 h,
Y = good after 80° C./1 h but not good at 150° C./1 h, and
Z = bad at both 80° C./1 h and 150° C./1 h.
Note:
For EUVL the PCD time must be at least 1 hour so that the exposure can be done safely.

Figure 5:
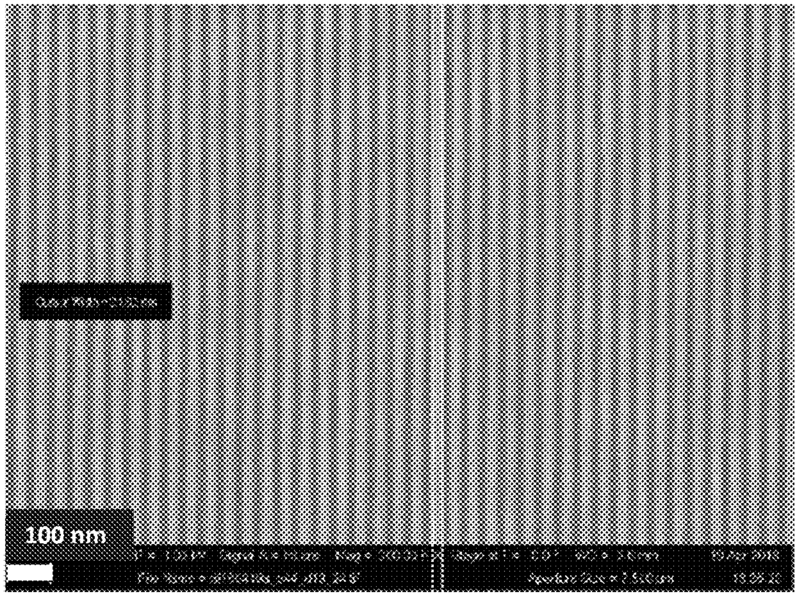
FIG. 5 is an SEM image showing 22 nm half pitch patterned lines with LER=1.5 nm obtained by EUVL using the material in Example 1 at an applied EUV dose of 65.4 $mJ/cm^2$.
Figure 6A:
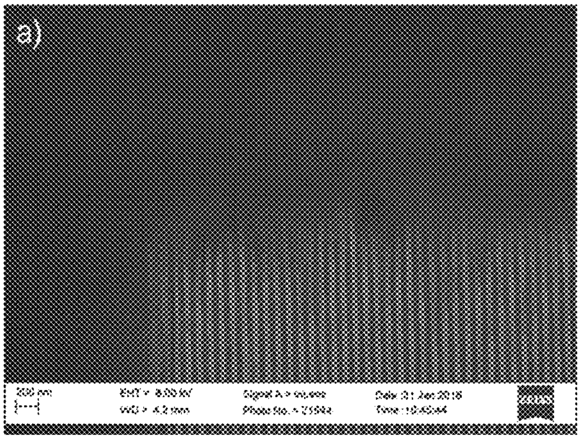
FIG. 6A is an SEM image of lines with 50 nm HP of using a 2% polymer prepared in Comparative Example 1 at a dose of 5000 $\mu C/cm^2$.
Figure 6B:
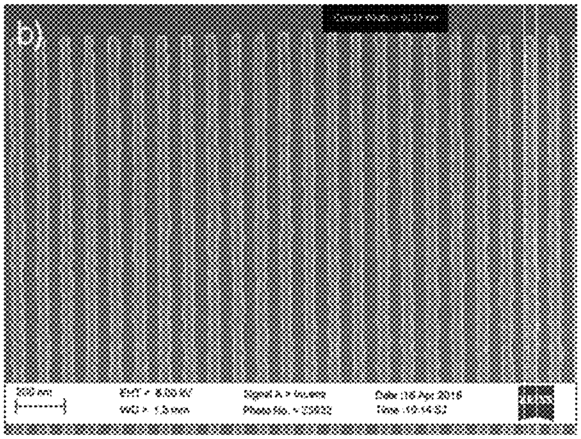
FIG. 6B is an SEM image of lines with 50 nm HP of using a 2% polymer prepared in Example 1 at a dose of 450 $\mu C/cm^2$.

Evaluation of results: Example 1 demonstrates high resolution patterning with low LER (FIG. 5). Example 1 similarly shows (FIG. 6) high sensitivity to radiation compared to similar material prepared with lower silanol content (comparative examples). On the other hand, too high silanol content leads to a material which has poor PCD performance (examples 3-5). Thus, preferably the ration of the Si—H to Si—OH peak height ratio (FIG. 7) should be more than 4 but less than 100 but, or more preferably more than 3 but less than 50.

Example 6

Preparation of Polymer Solution with HTEOS: HFIPTEOS=99:1 Molar Ratio

In one flask an amount of 5.941 grams of HTEOS and 0.136 grams of 3-hydroxy-3,3-bis(trifluoro-methyl)propyltriethoxysilane (HFIPTEOS) with molar ratio of 99:1 was dissolved in 11.729 grams of MeOTHF. A mixture of 2.930 grams of EtOTHF, 1.300 grams of DIW and 0.590 gram of 0.01 mole nitric acid was mixed and added to the above HTEOS and HFIPTEOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with 0.2-micron filter. Gel permeation chromatography data shows Mw of 3970, Mn of 2023, and polydispersity of 1.96.

Example 7

HTEOS: HFIPTEOS=97.5:2.5 Molar Ratio

In one flask an amount of 5.744 grams of HTEOS and 0.334 grams of HFIPTEOS with molar ratio of 97.5:2.5 was dissolved in 11.729 grams of MeOTHF. A mixture of 2.930 grams of EtOTHF, 1.290 grams of DIW and 0.590 gram of 0.01 mole nitric acid was mixed and added to the above HTEOS and HFIPTEOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with 0.2-micron filter. Gel permeation chromatography data shows Mw of 3519, Mn of 1766, and polydispersity of 1.99.

Example 8

HTEOS: HFIPTEOS=95:5 Molar Ratio

In one flask an amount of 5.430 grams of HTEOS and 0.648 grams of HFIPTEOS with molar ratio of 95:5 was dissolved in 11.729 grams of MeOTHF. A mixture of 2.930 grams of EtOTHF, 1.290 grams of DIW and 0.590 gram of 0.01 mole nitric acid was mixed and added to the above HTEOS and HFIPTEOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with 0.2-micron filter. Gel permeation chromatography data shows Mw of 3069, Mn of 1569, and polydispersity of 1.95.

Example 9

HTEOS: HFIPTEOS=90:10 Molar Ratio

In one flask an amount of 4.855 grams of HTEOS and 1.223 grams of HFIPTEOS with molar ratio of 90:10 was dissolved in 11.729 grams of MeOTHF. A mixture of 2.930 grams of EtOTHF, 1.290 grams of DIW and 0.590 gram of 0.01 mole nitric acid was mixed and added to the above HTEOS and HFIPTEOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with 0.2-micron filter. Gel permeation chromatography data shows Mw of 2661, Mn of 1524, and polydispersity of 1.74.

Example 10

Polymer 1+HFIPTEOS=97.5:2.5 Molar

Polymer made in example 1 was diluted with PGMEA to obtain 2% solid content solution. An amount of HFIPTEOS was added with a molar ratio of polymer 1: HFIPTEOS=97.5:2.5 molar ratio. The two solutions were mixed at room temperature for 30 minutes. The final solution was then filtered with a 0.2-micron filter.

Testing of Polymers

The molecular weights of the polymers of Examples 1 and 6 to 9 were determined on GPC. Film samples of the various polymers were prepared by spin coating of the polymer solution, 2%, with a spinning speed of 1500 rpm for 30 seconds. Soft bake was then carried out with temperature ranging from 80° C. to 150° C. for 30 seconds to 2 minutes. GPC data and data on post coating delay of the materials are given in Table 3.

TABLE 3

GPC data and post coating delay of the materials produced with different compositions.

| Example | GPC data Mw/Mn/PD | Post coating delay PCD 80° C. | 150° C. |
|---|---|---|---|
| Example 1 | 5001/2239 | X | X |
| Example 6 | 3970/2023 | X | X |
| Example 7 | 3519/1766 | X | X |
| Example 8 | 3069/1569 | X | X |
| Example 9 | 2661/1524 | X | X |

Legends (for PCD results):
X = good for at least 1 h of PCD after bake at 80° C/1 h and 150° C./1 h,
Y = good after 80° C./1 h but not good at 150° C./1 h, and
Z = bad at both 80° C./1 h and 150° C./1 h.
Note:
for EUVL the PCD time must be at least 1 hour so that the exposure can be done safely.

Evaluation of results. Examples 6-9 demonstrate the effect of the functional group enhancing the solubility to developer. Addition of the functional group further decreases the needed dose to obtain pattern as shown in FIG. 8. Additionally, the use of such functional groups permits the use of less concentrated developer solutions which reduces costs of the process and reduces environmental and health concerns. Example 10 shows that the resin compositions can be obtained by hydrolysis of precursors separately or in simultaneously (Examples 6-9).

Example 11

HTEOS: MTEOS=90:10 Molar Ratio

In one flask an amount of 5.423 grams of HTEOS and 0.654 grams of methyltriethoxysilane (MTEOS) with molar ratio of 90:10 was dissolved in 11.729 grams of MeOTHF. A mixture of 2.930 grams of EtOTHF, 1.290 grams of DIW and 0.590 gram of 0.01 mole nitric acid was mixed and added to the above HTEOS and MTEOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with 0.2-micron filter. Gel permeation chromatography data shows Mw of 2525, Mn of 1277, and polydispersity of 1.97.

Example 12

HTEOS: DMDEOS=90:10 Molar Ratio

In one flask an amount of 5.524 grams of HTEOS and 0.554 grams of dimethyldiethoxysilane (DMDEOS) with molar ratio of 90:10 was dissolved in 11.729 grams of MeOTHF. A mixture of 2.930 grams of EtOTHF, 1.290 grams of DIW and 0.590 gram of 0.01 mole nitric acid was mixed and added to the above HTEOS and DMDEOS solution into three equal portions in 1.5 hours. After the completion of addition, the reaction was continued to mix for another 20 hours. Evaporation was carried out to obtain 21-25% of solid content. MEK was added four times to the polymer weight. The obtained polymer solution was filtered with a 0.2-micron filter. Gel permeation chromatography data shows Mw of 2207, Mn of 1148, and polydispersity of 1.92.

Example 13

HTEOS: PhTMOS=90:10 Molar Ratio

In one flask an amount of 5.359 grams of HTEOS and 0.719 grams of PhTMOS with molar ratio of 90:10 was dissolved in 11.729 grams of MeOTHF. A mixture of 2.930 grams of EtOTHF, 1.250 grams of DIW and 0.570 gram of 0.01 mole nitric acid was mixed and added to the above HTEOS and PhTMOS solution into three equal portions in 1.5 hours. After the completion of addition, the reaction was continued to mix for another 20 hours. Evaporation was carried out to obtain 21-25% of solid content. Methyl ethyl ketone (MEK) was added four times to the polymer weight. The obtained polymer solution was filtered with 0.2-micron filter. Gel permeation chromatography data shows Mw of 1930, Mn of 746, and polydispersity of 2.59

Evaluation of results. Examples 11-13 demonstrate the effect of several other monomers which can be used to copolymerize with HTEOS or other hydrogen containing precursors.

Example 14

Polymer 1+Titanium Oxide=98:2 wt-%

Titanium oxide nanoparticle were synthesized by dissolving titanium(IV) isopropoxide (TIIP, 15.887 grams) in isopropanol (200 g). A mixture of aqueous nitric acid 0.01 M (5.033 grams), acetic acid (3.357 grams), and IPA (200 g) was separately prepared and drop wise added into the TIIP solution. Reaction was carried out at room temperature for 6 h, then PGME (500 grams) was added to the reaction mixture and IPA was removed from the solution via a rotary evaporator. Solvent evaporation was continued to obtain a 2 wt-% solid solution. Product was finally obtained after filtering the solution through 0.2-micron filter. Then, polymer made in example 1 was diluted with PGMEA to obtain 2% solid content solution. An amount of titanium oxide nanoparticles was added with a mass ratio of polymer 1: TiOx=98:2 by wt-%. The two solutions were mixed at room temperature for 30 minutes. The solution was then filtered with 0.2 micrometer filter.

Example 15

Polymer 1+Titanium Oxide=95:5 wt-%

The steps of prepare sample is similar to Example 17, except the amount of titanium oxide was added to be 5 wt-%.

Example 16

Polymer 1+Titanium Oxide=90:10 wt-%

The steps of preparing the sample are similar to those in Example 15, except the amount of titanium oxide was added to be 10 wt-%.

Example 17

Polymer 1+Titanium Aluminum Oxide=97:3 wt-%

Polymer made in example 1 was diluted with PGMEA to obtain 2% solid content solution. An amount of titanium aluminum oxide nanoparticles was added with a mass ratio of polymer 1: titanium aluminum oxide=97:3. Mixing of two solutions were obtained at room temperature for 30 minutes. Solution was then filtered with 0.2-micron filter.

Example 18

Polymer 1+Titanium Aluminum Oxide=90:10 wt-%

Titanium aluminum oxide nanoparticle synthesis was carried by controlled hydrolysis/condensation of TIIP and aluminum isopropoxide (AlOiPr). In a round bottom flask equipped with a magnetic bar, a mixture of TIIP (27.831 grams) and AlOiPr (5 grams) was dissolved in IPA (320 grams) solvent. The Ti:Al molar ratio is 8:2. In another flask, a mixture of 8.377 grams of water, 7.350 grams of acetic acid, and 200 grams of IPA was mixed. The solution in the second flask was drop wise added to the monomer solution. After the addition was completed, 200 grams of PGME was added to the reaction mixture and the stirring was continued at room temperature for 16 hours. The IPA and water were then evaporated to obtain a 2% solid solution. The reaction product was finally achieved after filtering the solution through 0.2-micron filter.

The steps of sample preparation are similar to those of Example 17, except the amount of titanium aluminum oxide was added to be 10 wt-%.

Example 19

Polymer 1+Hafnium Oxide Nanoparticles=90:10 wt-%

Hafnium oxide nanoparticle synthesis: nanoparticles were synthesized by a controlled hydrolysis/condensation of hafnium (IV) n-butoxide. An amount of 20 grams hafnium (IV) n-butoxide (95%) was dissolved in n-butanol solvent (800 grams). An amount of methacrylic acid (MAA, 5.26 grams) with a molar ratio of Hafnium:MAA=1:1.5 was added and mixed for 1 hours. Hydrolysis step was carried out at room temperature by drop wise addition of a mixture of water (2.91 grams) and n-BuOH (600 grams) to the reaction medium. After the addition was completed, the reaction was continued for 20 hours. The n-butanol was then evaporated until a 3% solid solution was obtained. The reaction product was achieved after filtering the solution with 0.2-micron filter. Then, polymer made in example 1 was diluted with PGMEA to obtain 2% solid content solution. An amount of hafnium oxide nanoparticles was added with a mass ratio of polymer 1: HfOx=90:10 by mass ratio. The two solutions were mixed at room temperature for 30 minutes. The solution was then filtered with 0.2 micrometer plastic micron.

Polymer Testing

The molecular weights of the polymers of Examples 14 to 18 were determined on GPC. Film samples were prepared by spin coating the polymer solution, 2%, with a spinning speed of 1500 rpm for 30 seconds. Soft bake was then carried out with temperature ranging from 80° C. to 150° C. for 30 seconds to 2 minutes.

GPC data and data on post coating delay of the materials are given in Table 4.

TABLE 4

Post coating delay of the materials produced with different compositions.

| Example | Post coating delay PCD 80° C. | 150° C. |
| --- | --- | --- |
| Example 14 | X | X |
| Example 15 | X | X |
| Example 16 | X | Y |

TABLE 4-continued

Post coating delay of the materials produced with different compositions.

| Example | Post coating delay PCD 80° C. | Post coating delay PCD 150° C. |
|---|---|---|
| Example 17 | X | X |
| Example 18 | X | X |
| Example 19 | X | X |

Legends (for PCD results):
X = good for at least 1 h of PCD after bake at 80° C./1 h and 150° C./1 h,
Y = good after 80° C./1 h but not good at 150° C./1 h, and
Z = bad at both 80° C./1 h and 150° C./1 h.
Note:
for EUVL the PCD time must be at least 1 hour so that the exposure can be done safely.

Evaluation of results. Examples 14-19 demonstrate the beneficial effect of added metal oxide materials. Addition of only few weight percentages of metal oxide materials can substantially reduce the required dose.

FIG. 9 shows the e-beam results of a) Example 1, b) Example 14, and c) Example 17. The required dose to obtain pattern decreased by b) 17% and c) 33%.

Example 20

Polymer 1+Photoacid

The polymer in Example 1 was diluted with PGMEA to obtain solution with a 2% solid content. An amount of 5 wt-% of Iodonium, (4-methylphenyl)[4-(2-methylpropyl) phenyl]-, hexafluorophosphate(1-), which is a photoacid, was added to the polymer solution. A magnetic stirrer was used to disperse photoacid in the polymer solution.

The polymer containing photobase shows slightly enhanced e-beam sensitivity compared to that of the polymer without photoacid.

Example 21

Polymer 1+Photobase

The polymer in Example 1 was diluted with PGMEA to obtain solution with 2% solid content. An amount of 5 wt-% of (Z)-{[Bis(dimethylamino)methylidene]amino}-N-cyclohexyl(cyclohexylamino)-methaniminiumtetrakis(3-fluorophenyl)borate, which is a photobase, and 2 wt-% of 2-isopropylthioxanthone as a sensitizer were added to the polymer solution.

The polymer containing photobase shows slightly enhanced e-beam sensitivity compared to that of the polymer without photobase and sensitizer.

Evaluation of results: Examples 20 and 21 demonstrate (FIG. 10) that the materials can be formulated with common photoacid and photobase generators to obtain resin compositions with similar performance to Example 1.

ABBREVIATIONS

CAR chemically amplified resist
EBL electron beam lithography
EUV extreme ultraviolet (wavelength)
EUVL extreme ultraviolet lithography
GPC gel permeation chromatography
HSQ hydrogen silsesquioxane
LER line-edge roughness
LWR line width roughness
NIL nanoimprint lithography
PBL photon beam lithography
PCD post coating delay
SEM scanning electron microscope
TEOS tetraethoxysilane
TMAH tetramethylammonium hydroxide

LIST OF REFERENCES

Non-Patent Literature

1. Okoroanyanwu, U. Molecular Theory of Lithography. (SPIE Press, 2015).
2. Gangnaik, A. S., Georgiev, Y. M. & Holmes, J. D. New Generation Electron Beam Resists: A Review. Chem. Mater. 29, 1898-1917 (2017).
3. Simone, D. De et al. Progresses and Challenges of EUV Lithography Materials. J. Photopolym. Sci. Technol. 27, 601-610 (2014).
4. Higgins, C. D. et al. Resolution, line-edge roughness, sensitivity tradeoff, and quantum yield of high photo acid generator resists for extreme ultraviolet lithography. Jpn. J. Appl. Phys. 50, 1-8 (2011).
5. De Simone, D., Vesters, Y. & Vandenberghe, G. Photoresists in extreme ultraviolet lithography (EUVL). Adv. Opt. Technol. 6, 163-172 (2017).
6. Takeo Watanabe. Current status and prospect for EUV lithography. 2017 7th Int. Conf. Integr. Circuit, Des. Verif. 3-8 (2017).
7. Grigorescu, A. E. & Hagen, C. W. Resists for sub-20-nm electron beam lithography with a focus on HSQ: State of the art. Nanotechnology 20, 292001 (2009).
8. Yang, J. K. W. et al. Understanding of hydrogen silsesquioxane electron resist for sub-5-nm-half-pitch lithography. J. Vac. Sci. Technol. B Microelectron. Nanom. Struct. 27, 2622 (2009).

The invention claimed is:

1. A method for producing a semiconductor device, comprising:

- applying one or more resist underlayer films onto a semiconductor substrate;
- applying a coating composition as a resist onto the one or more resist underlayer films and baking the composition to form a resist film;
- exposing the resist film to light;
- after the light exposure, developing the resist film to form a resist pattern;
- etching the one or more resist underlayer films using the resist pattern; and
- fabricating the semiconductor substrate using the resist film thus patterned and the one or more resist underlayer films thus patterned, wherein the coating composition comprises, in liquid phase, a solvent and a resin having the general formula (I):

(I)

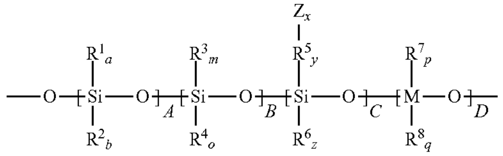

wherein

A, B, C, and D each represent an integer independently selected from 1 to 1000;

Z stands for a functional group and M stands for a metal atom:

$R^1$ to $R^8$ stand for hydrocarbyl radicals; and a, b, m, o, y, z, p, q and x each independently stand for an integer of 0 to 3, wherein the resin has a silicon content of 35% by weight or more, wherein the metal is selected from the group consisting of antimony, bismuth, germanium, hafnium, iron, molybdenum, cerium, lanthanum, yttrium, tin, titanium, zirconium, aluminium, and combinations thereof, and wherein the coating composition is a resist coating.

2. A method of producing a semiconductor device, comprising:

forming an organic underlayer film on a semiconductor substrate;

applying a coating composition for forming a resist film onto the organic underlayer film and baking the coating composition to form a resist film;

exposing the resist film to light;

after the light exposure, developing the resist film to form a resist pattern;

etching a resist underlayer film using the resist pattern;

etching the organic underlayer film using the resist underlayer film thus patterned; and fabricating the semiconductor substrate using the organic underlayer film thus patterned, wherein the coating composition comprises, in liquid phase, a solvent and a resin having the general formula (I):

(I)

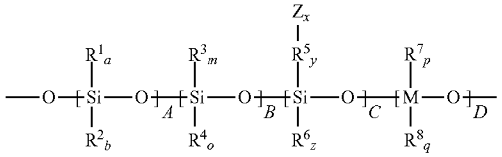

wherein

A, B, C, and D each represent an integer independently selected from 1 to 1000;

Z stands for a functional group and M stands for a metal atom;

$R^1$ to $R^8$ stand for hydrocarbyl radicals; and a, b, m, o, y, z, p, q and x each independently stand for an integer of 0 to 3, wherein the resin has a silicon content of 35% by weight or more, wherein the metal is selected from the group consisting of antimony, bismuth, germanium, hafnium, iron, molybdenum, cerium, lanthanum, yttrium, tin, titanium, zirconium, aluminium, and combinations thereof, and wherein the coating composition is a resist coating.

* * * * *